(12) United States Patent
Kuroki

(10) Patent No.: US 8,433,259 B2
(45) Date of Patent: Apr. 30, 2013

(54) GYRATOR CIRCUIT, WIDE-BAND AMPLIFIER AND RADIO COMMUNICATION APPARATUS

(75) Inventor: Shouichi Kuroki, Kagoshima (JP)

(73) Assignee: Sony Corporation, Tokyo (JP)

( * ) Notice: Subject to any disclaimer, the term of this patent is extended or adjusted under 35 U.S.C. 154(b) by 250 days.

(21) Appl. No.: 13/064,217

(22) Filed: Mar. 11, 2011

(65) Prior Publication Data
US 2011/0294446 A1    Dec. 1, 2011

(30) Foreign Application Priority Data
May 26, 2010  (JP) ................. 2010-120552

(51) Int. Cl.
*H04B 17/00* (2006.01)

(52) U.S. Cl.
USPC ......................... 455/115.1; 330/252

(58) Field of Classification Search ........... 455/91, 455/115.1, 115.2, 115.3, 126, 127.1, 129; 330/251, 253, 258, 260
See application file for complete search history.

(56) References Cited

U.S. PATENT DOCUMENTS

| | | | |
|---|---|---|---|
| 5,436,594 A * | 7/1995 | Pace et al. | 330/258 |
| 2005/0090209 A1 * | 4/2005 | Behzad | 455/115.1 |
| 2006/0250185 A1 * | 11/2006 | Sanduleanu et al. | 330/253 |

FOREIGN PATENT DOCUMENTS

| | | |
|---|---|---|
| JP | 2003-298355 | 10/2003 |
| JP | 2009-033643 | 2/2009 |

* cited by examiner

*Primary Examiner* — Thanh Le
(74) *Attorney, Agent, or Firm* — Rader, Fishman & Grauer PLLC

(57) ABSTRACT

Disclosed herein is a gyrator circuit, including, a first transconductance amplifier, a capacitor, and a second transconductance amplifier, wherein the differential input terminals of the first transconductance amplifier and the differential output terminals of the second transconductance amplifier being separated from each other.

4 Claims, 6 Drawing Sheets

GYRATOR CIRCUIT, WIDE-BAND AMPLIFIER AND RADIO COMMUNICATION APPARATUS

BACKGROUND OF THE INVENTION

1. Field of the Invention

This invention relates to a gyrator circuit, a wide-band amplifier and a radio communication apparatus.

2. Description of the Related Art

Various circuits which use a gyrator circuit have hitherto been proposed.

For example, Japanese Patent Laid-Open No. 2003-298355 proposes, as a technique for varying an output frequency characteristic of a differential amplifier, a technique wherein an active inductor configured from a gyrator circuit is used to configure a band-pass filter for a load of a differential amplifier.

Meanwhile, Japanese Patent Laid-Open No. 2009-33643 proposes a technique wherein a resonance circuit including an active inductor configured from a gyrator circuit is used to configure a band-pass filter for a load of a differential identifier.

SUMMARY OF THE INVENTION

However, the amplifier hitherto known wherein a gyrator circuit is connected to a differential amplifier restricts the output frequency band of part of a frequency band that a differential amplifier has, but does not expand the frequency band which the differential amplifier has.

Therefore, it is desirable to provide a gyrator circuit which can expand the frequency band that a differential amplifier has and a wide-band amplifier and a radio communication apparatus which includes the gyrator circuit.

According to an embodiment of the present invention, there is provided a gyrator circuit, including a first transconductance amplifier formed from a pair of transistors whose bases or gates serve as differential input terminals of the first transconductance amplifiers and whose collectors or drains serve as differential output terminals of the first transconductance amplifier, a capacitor connected between the differential output terminals of the first transconductance amplifier, and a second transconductance amplifier formed from a pair of transistors whose emitters or sources serve as differential input terminals of the second transconductance amplifiers and whose collectors or drains serve as differential output terminals of the second transconductance amplifier, wherein the differential input terminals of the first transconductance amplifier and the differential output terminals of the second transconductance amplifier being separated from each other.

According to another embodiment of the present invention, there is provided a wide-band amplifier including the gyrator circuit described above, and a differential amplifier, wherein differential input terminals of the differential amplifier are connected to the differential input terminals of the first transconductance amplifier of the gyrator circuit, and differential output terminals of the differential amplifier are connected to the differential output terminals of the second transconductance amplifier.

Preferably, the input terminals of the differential amplifier are connected to the differential input terminals of the first transconductance amplifier each through an emitter follower circuit.

According to a further embodiment of the present invention, there is provided a radio communication apparatus including an antenna, a transmission circuit for outputting a transmission signal to the antenna so that a radio signal is outputted from the antenna, an impedance matching circuit connected between the antenna and the transmission circuit, a detection circuit for detecting a traveling wave and a reflected wave of the transmission signal, a power measuring circuit for measuring power of the traveling wave and power of the reflected wave, and a control circuit for controlling the impedance matching circuit based on a result of the measurement by the power measuring circuit, wherein the power measuring circuit includes a limiter amplifier section formed by cascade connection of a plurality of the wide-band amplifiers described above, a plurality of detection sections for individually detecting outputs of the wide-band amplifier, and an addition section for adding outputs of the detection sections.

In the gyrator circuit, wide-band amplifier and radio communication apparatus, a drop of the gain in the high frequency region at the upper limit of the frequency band of the differential amplifier is improved by resonance of the active inductor formed from the gyrator circuit and the parasitic capacitance. Further, the gain which the differential amplifier has is dropped in the low frequency region by a feedforward operation thereby to relatively improve the drop of the gain in the high frequency region. Consequently, the frequency band can be expanded.

DETAILED DESCRIPTION OF THE PREFERRED EMBODIMENT

1. Outline of the Gyrator Circuit

A gyrator circuit according to an embodiment of the present invention includes a first transconductance amplifier, a capacitor and a second transconductance amplifier.

The first transconductance amplifier is formed from a pair of transistors whose bases or gates serve as differential input terminals of the first transconductance amplifier and whose collectors or drains serve as differential output terminals of the first transconductance amplifier. The capacitor is connected between the differential output terminals of the first transconductance amplifier. Meanwhile, the second transconductance amplifier is formed from a pair of transistors whose emitters or sources serve as differential input terminals of the second transconductance amplifier and whose collectors or drains serve as differential output terminals of the second transconductance amplifier.

The differential input terminals of the first transconductance amplifier and the differential output terminals of the second transconductance amplifier are separated from each other.

If the gyrator circuit having such a configuration as described above is used, then a wide-band amplifier which expands the frequency band that a differential amplifier has can be provided.

In particular, the differential input terminals of a differential amplifier are connected to the differential input terminals of the first transconductance amplifier of the gyrator circuit. Further, the differential output terminals of the differential amplifier are connected to the differential output terminals of the second transconductance amplifier of the gyrator circuit thereby to configure a wide-band amplifier.

By configuring the wide-band amplifier in this manner, the gain which the differential amplifier has can be lowered in a low frequency region by a feedforward operation by the gyrator circuit, whereby a gain drop in a high frequency region can be improved relatively. Further, a drop of the gain in a high frequency region at an upper limit of the frequency band of the differential amplifier can be improved by resonance of an active inductor by this gyrator circuit and parasitic capacitance. As a result, the wide-band amplifier which expands the frequency band which the differential amplifier has can be provided.

This wide-band amplifier can be applied, for example, to a power measuring circuit of a radio communication apparatus and various other circuits.

2. Particular Configuration of the Wide-Band Amplifier

In the following, a configuration of a wide-band amplifier which uses a gyrator circuit according to an embodiment of the present invention is described particularly with reference to the accompanying drawings.

Figure 1:
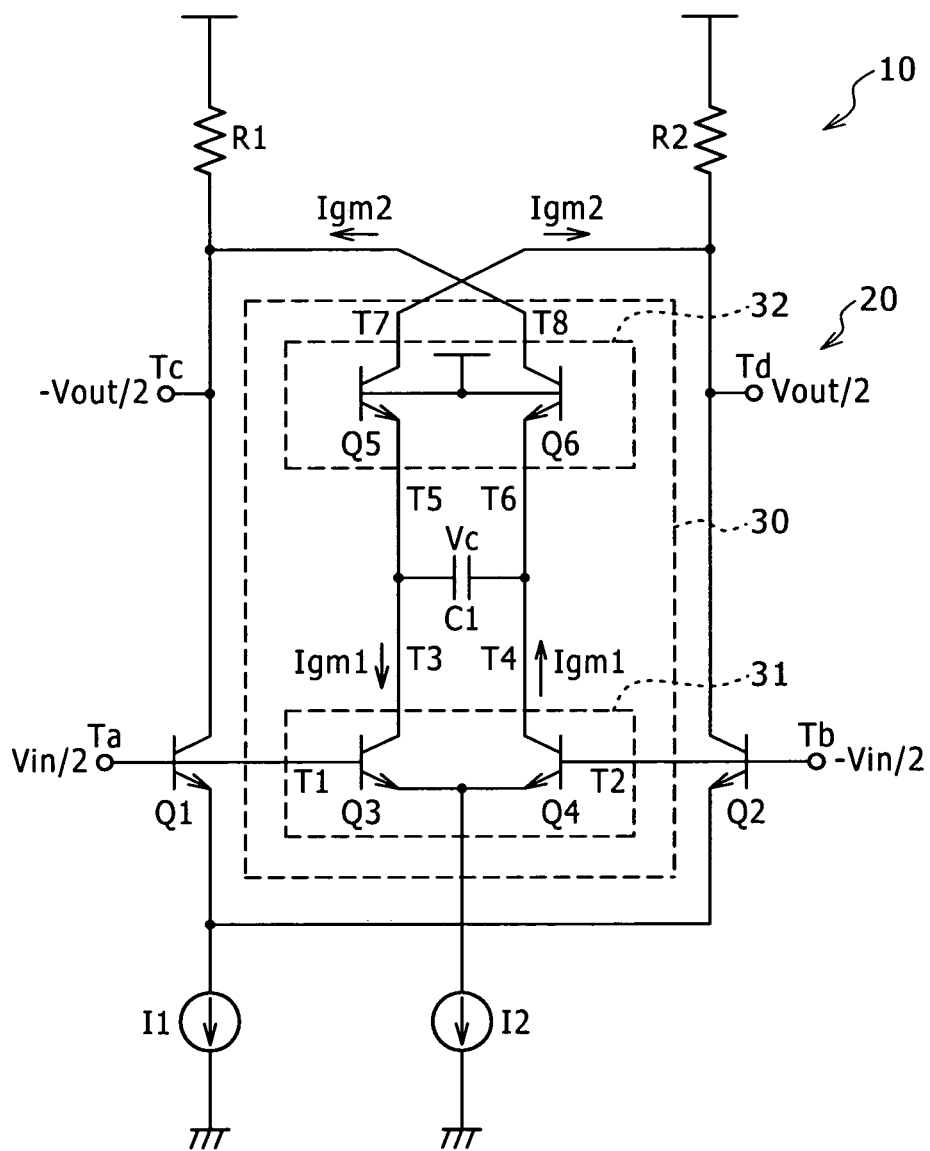
FIG. 1 is a circuit diagram showing a configuration of a wide-band amplifier which uses a gyrator according to an embodiment of the present invention.

Referring first to FIG. 1, the wide-band amplifier 10 according to the present embodiment includes a differential amplifier 20 and a gyrator circuit 30.

The differential amplifier 20 includes transistors Q1 and Q2 whose emitters are connected commonly to form a differential pair, a pair of resistors R1 and R2 connected between the collectors of the transistors Q1 and Q2 and a power supply VDD, and a current source I1. The current source I1 is connected between the emitters of the transistors Q1 and Q2 and the ground GND. In this differential amplifier 20, the bases of the transistors Q1 and Q2 serve as differential input terminals Ta and Tb, respectively, and the collectors of the transistors Q1 and Q2 serve as differential output terminals Tc and Td, respectively.

The gyrator circuit 30 supplies current corresponding to a voltage inputted to the differential input terminals Ta and Tb to the differential output terminals Tc and Td. The gyrator circuit 30 includes a first transconductance amplifier 31 (hereinafter referred to as first gm amplifier 31), a second transconductance amplifier 32 (hereinafter referred to as second gm amplifier 32), a capacitor C1, and a current source I2.

The first gm amplifier 31 is configured from a pair of transistors Q3 and Q4 whose emitters are connected commonly to the current source I2. The bases of the transistors Q3 and Q4 serve as differential input terminals T1 and T2 of the first gm amplifier 31, and the collectors of the transistors Q3 and Q4 serve as differential output terminals T3 and T4 of the first gm amplifier 31, respectively. The first gm amplifier 31 outputs current of a phase same as that of a voltage inputted to the differential input terminals T1 and T2 from the differential output terminals T3 and T4.

The capacitor C1 has a capacitance value adjusted so that the gyrator circuit 30 may carry out two characteristic operations hereinafter described.

The second gm amplifier 32 is configured from a pair of transistors Q5 and Q6 whose bases are connected commonly to the power supply VDD. The emitters of the transistors Q5 and Q6 serve as differential input terminals T5 and T6 of the second gm amplifier 32 and the collectors of the transistors Q5 and Q6 serve as differential output terminals T7 and T8 of the second gm amplifier 32, respectively.

In the gyrator circuit 30, the differential input terminals T1 and T2 of the first gm amplifier 31 and the differential output terminals T7 and T8 of the second gm amplifier 32 are separated from each other.

In the gyrator circuit 30 configured in such a manner as described above, the differential input terminals T1 and T2 of the first gm amplifier 31 serve as the differential input terminals of the gyrator circuit 30 while the differential output terminals T7 and T8 of the second gm amplifier 32 serve as the differential output terminals of the gyrator circuit 30.

The differential input terminals of the gyrator circuit 30 are connected to the differential input terminals Ta and Tb of the differential amplifier 20. Meanwhile, the differential output terminals of the gyrator circuit 30 are connected to the output terminals of the differential amplifier 20. In particular, the differential input terminals Ta and Tb are connected to the differential input terminals T1 and T2 of the first gm amplifier 31, and the differential output terminals Td and Tc of the differential amplifier 20 are connected to the differential output terminals T7 and T8 of the second gm amplifier 32 of the gyrator circuit, respectively.

3. Operation and Characteristics of the Wide-Band Amplifier 10

The wide-band amplifier 10 configured in such a manner as described above is corresponds to the differential amplifier 20 to which two operations of the gyrator circuit 30 are added. One of the operations is an operation as an active inductor on the frequency band upper limit side while the other operation is an operation as a feedforward amplifier.

Operation as an Active Inductor

Figure 2:
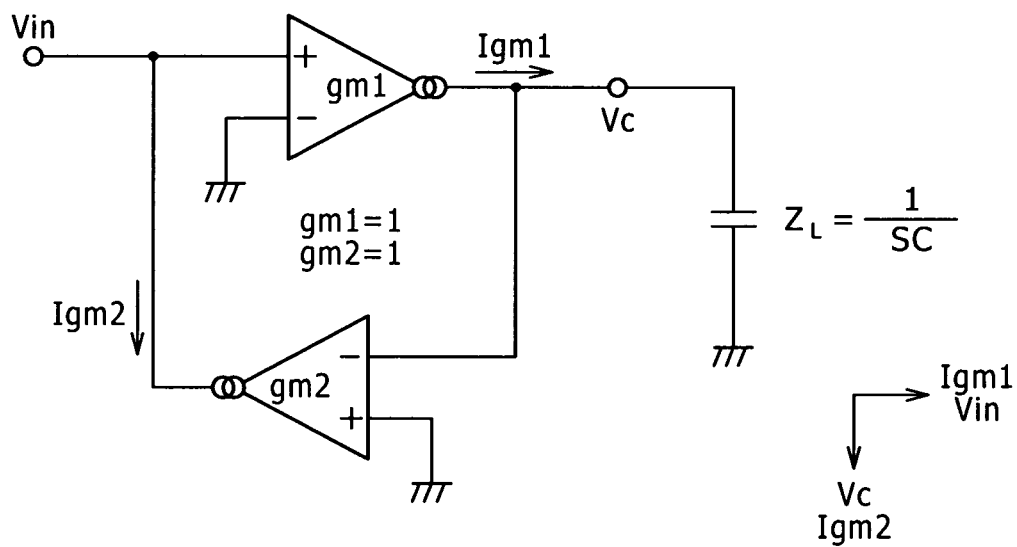
FIG. 2 is a circuit diagram illustrating a principle of operation of the gyrator circuit shown in FIG. 1 as an active inductor.

First, an operation as an active inductor is described. FIG. 2 illustrates a principle of operation of the gyrator circuit 30 as an active inductor.

Referring to FIG. 2, in the gyrator circuit 30 shown, an input voltage Vin inputted to the differential input terminals Ta and Tb of the differential amplifier 20 is converted into current Igm1 of a phase same as that of the input voltage Vin by the first gm amplifier 31. In a high frequency region, the current Igm1 flows to the capacitor C1 which is a load to the first gm amplifier 31. As a result, a voltage Vc is generated across the capacitor C1. The voltage Vc of the capacitor C1 has a phase delayed by 90 degrees with respect to the current Igm1 generated by the first gm amplifier 31. Accordingly, the capacitor C1 functions as a phase shifting element.

The voltage Vc of the capacitor C1 is inputted to the differential input terminals T5 and T6 of the second gm amplifier 32, and current Igm2 corresponding to the voltage Vc is outputted from the differential output terminals T7 and T8 of the second gm amplifier 32. This current Igm2 has a phase delayed by 90 degrees with respect to the input voltage Vin.

In this manner, in the case where the capacitor C1 is provided as a load to the first gm amplifier 31, it is converted into an inductor by the operation of the gyrator circuit 30. In other words, the gyrator circuit 30 operates as an active inductor.

If the transconductance of the first gm amplifier 31 is represented by gm1, the transconductance of the second gm amplifier 32 by gm2 and the capacitance of the capacitor C1 by C, the inductance L of the inductor can be represented in such a manner as given by the following expression (1):

$$L = C/(gm1 \times gm2) \quad (1)$$

On the other hand, the differential amplifier 20 outputs a voltage Vout corresponding to the input voltage Vin inputted to the differential input terminals Ta and Tb thereof from the differential output terminals Tc and Td. If the gain of the differential amplifier 20 is represented by G, then when the gyrator circuit 30 is not connected, the voltage Vout of the differential amplifier 20 can be presented by the following expression:

$$V_{out} = -G \times V_{in}$$

As described above, the differential output terminals T8 and T7 of the gyrator circuit 30 are connected to the differential output terminals Tc and Td of the differential amplifier 20, respectively. Accordingly, if the input voltage Vin varies to vary the voltage Vout of the differential amplifier 20, then current Igm2 having a phase delayed by 90 degrees with respect to the voltage Vout flows to the differential output terminals Tc and Td. As a result, operation equivalent to that in the case where an inductor is connected to the differential output terminals Tc and Td of the differential amplifier 20 is obtained.

In this manner, in the wide-band amplifier 10, the differential input terminals T1 and T2 and the differential output terminals T7 and T8 of the gyrator circuit 30 are formed as terminals or nodes different from each other. Therefore, by adjusting the capacitance value of the capacitor C1, operation equivalent to that in the case where an inductor is connected to the differential output terminals Tc and Td of the differential amplifier 20 can be obtained in a high frequency region at the upper limit to the frequency band of the differential amplifier 20.

Operation as a Feedforward Amplifier

Now, operation of the gyrator circuit 30 as a feedforward amplifier is described.

In the gyrator circuit 30, an input voltage Vin inputted to the differential input terminals Ta and Tb of the differential amplifier 20 is inputted to the differential input terminals T1 and T2 and converted into current Igm1 of a phase same as that of the input voltage Vin by the first gm amplifier 31.

As described above, in the high frequency region at the upper limit of the frequency band of the differential amplifier 20, the current Igm1 flows to the capacitor C1. However, in the low frequency region, since the impedance of the capacitor C1 is high, the current Igm1 little flows to the capacitor C1 while most part thereof flows to the differential input terminals T5 and T6 of the second gm amplifier 32. Therefore, the current Igm2 flowing to the differential output terminals T7 and T8 of the second gm amplifier 32 has a phase same as that of the input voltage Vin.

On the other hand, to the differential output terminals Tc and Td of the differential amplifier 20, collector current of a phase opposite to that of the input voltage Vin flows from the transistors Q1 and Q2.

Accordingly, the current Igm2 flowing to the differential output terminals Tc and Td of the differential amplifier 20 from the gyrator circuit 30 has a phase opposite to that of the collector current of the transistors Q1 and Q2. Therefore, the gain of the wide-band amplifier 10 is lower than the gain of the differential amplifier 20.

In other words, in the low frequency region, the wide-band amplifier 10 operates as a feedforward amplifier and exhibits a dropped gain.

As described above, the gyrator circuit 30 operates, in the high frequency region, as an active inductor on the upper limit side of the passband but causes, in the low frequency region, the wide-band amplifier 10 to operate as a feedforward amplifier.

Characteristics of the Wide-Band Amplifier 10

Characteristics of the wide-band amplifier 10 configured in such a manner as described above are described.

Figure 3:
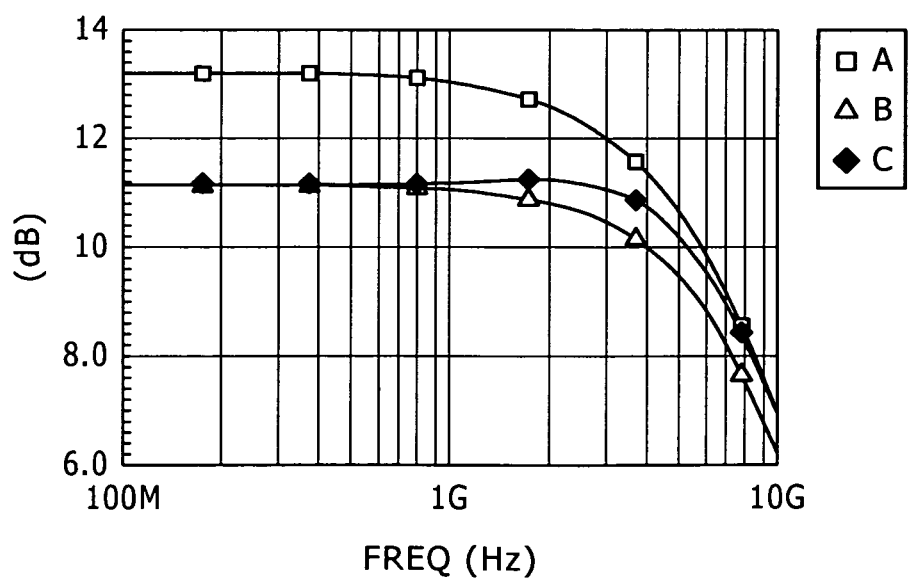
FIG. 3 is a view illustrating a characteristic of the wide-band amplifier shown in FIG. 1.

FIG. 3 illustrates a frequency characteristic A of the differential amplifier 20 to which the gyrator circuit 30 is not connected, a frequency characteristic B of the wide-band amplifier 10 from which the capacitor C1 is removed, and a frequency characteristic C of the wide-band amplifier 10.

The difference between the frequency characteristic A and the frequency characteristic B is an effect of gain improvement of the differential amplifier by the feedforward operation by the gyrator circuit 30. In particular, by the feedforward operation by the gyrator circuit 30, the gain of the differential amplifier in the low frequency region drops, and the dropping amount of the gain decreases from the region higher than 1 GHz. As a result, the low frequency band increases.

Meanwhile, the difference between the frequency characteristic B and the frequency characteristic C is an effect of the active inductor by the gyrator circuit 30. In particular, at any frequency from 2 GHz to 3 GHz of the high frequency region at the upper limit of the frequency band of the differential amplifier 20, an effect that the drop of the gain is improved by resonance between the parasitic capacitance involved in the output stage of the wide-band amplifier 10, that is, in the differential output terminals Tc and Td, and the active inductor is achieved.

In this manner, in the wide-band amplifier 10 according to the present embodiment, improvement of the frequency band width can be achieved by connecting the gyrator circuit 30 to the differential amplifier 20. In other words, the differential amplifier 20 is provided with an operation as an active inductor on the passband upper limit side of the differential amplifier 20 and an operation as a feedforward amplifier in the low frequency region by the gyrator circuit 30 to make it possible to achieve maximization of the frequency band as a total characteristic.

Further, the gyrator circuit 30 is configured such that the first gm amplifier 31 and the second gm amplifier 32 are connected in cascade connection to form a differential cascade amplifier. Therefore, the current source can be reduced from that of such a configuration as disclosed in Japanese Patent Laid-Open No. 2009-33642 mentioned hereinabove, that is, from that of a configuration composed of a combination of a differential amplifier and an emitter follower. Consequently, reduction in power consumption can be reduced.

Figure 4:
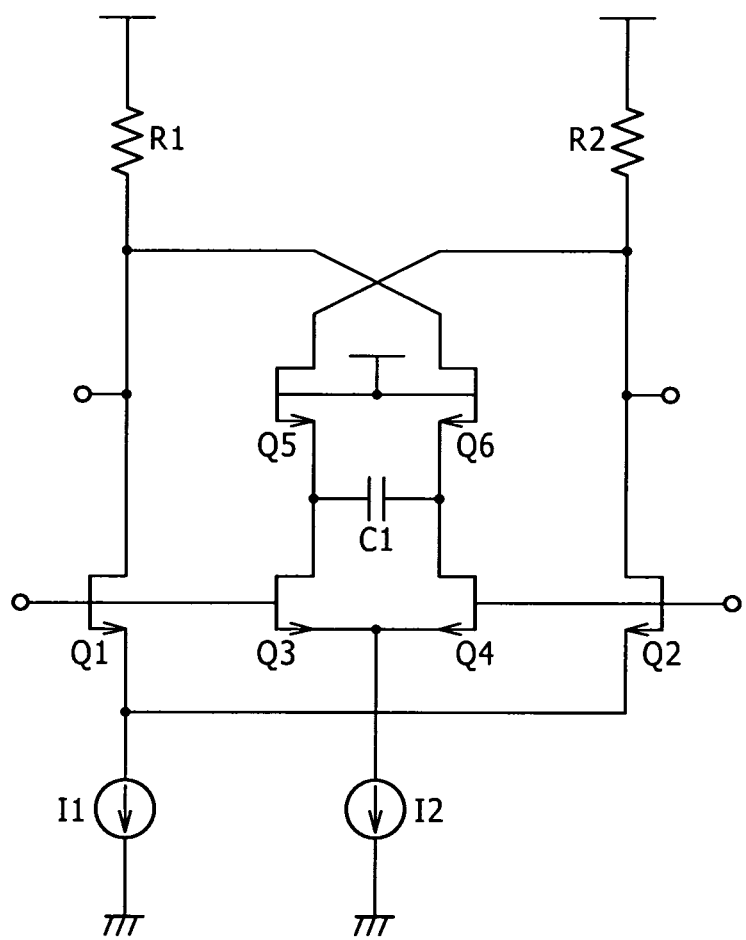
FIG. 4 is a circuit diagram showing a modification to the wide-band amplifier shown in FIG. 1.

It is to be noted that, while the transistors Q1 to Q6 in the embodiment described above are configured using a bipolar transistor, they may be configured otherwise using a MOS (Metal Oxide Semiconductor) transistor as seen in FIG. 4.

Figure 5:
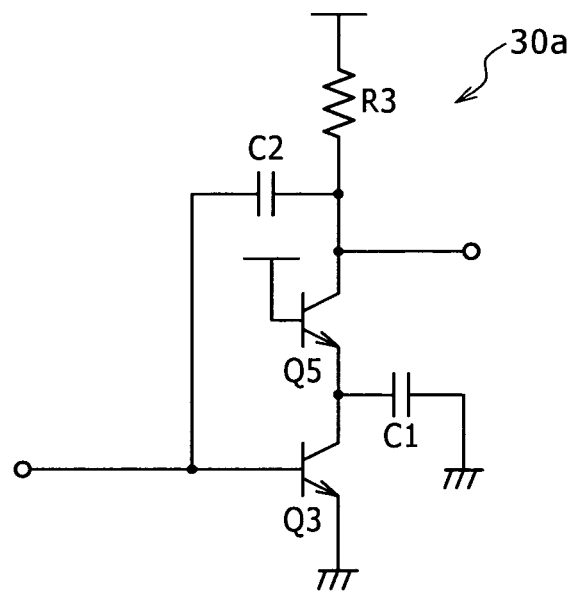
FIGS. 5 and 6 are circuit diagrams showing modifications to the gyrator shown in FIG. 1.
Figure 6:
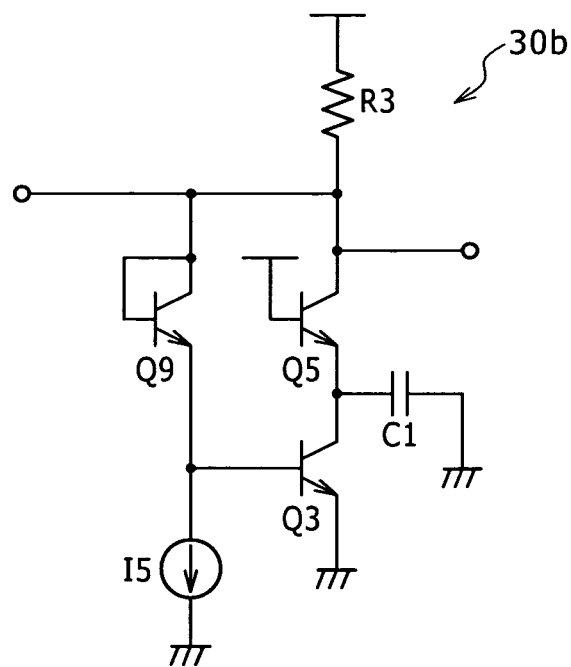

Or, the gyrator may otherwise be configured in such a manner as seen in FIG. 5 or 6. It is to be noted that, in each of FIGS. 5 and 6, a gyrator circuit not of a differential configuration but of a single configuration is shown for the convenience of illustration and description.

Referring to FIG. 5, in the gyrator circuit 30a shown, the transistor Q3 functions as a first gm amplifier and the transistor Q5 functions as a second gm amplifier. In the gyrator circuit 30, a capacitor C2 is provided between an input and an output of the gyrator circuit 30 to separate DC operating points between the input and the output from each other.

Referring now to FIG. 6, in the gyrator circuit 30b shown, a transistor Q9 connected in diode connection is provided between the input and the output of the gyrator circuit 30b in place of the capacitor C2 of the gyrator circuit 30a shown in FIG. 5, and a current source I5 is provided between the input of the gyrator circuit 30b and the ground GND. By this configuration, the DC operation pints between the input and the output are adjusted.

Figure 7:
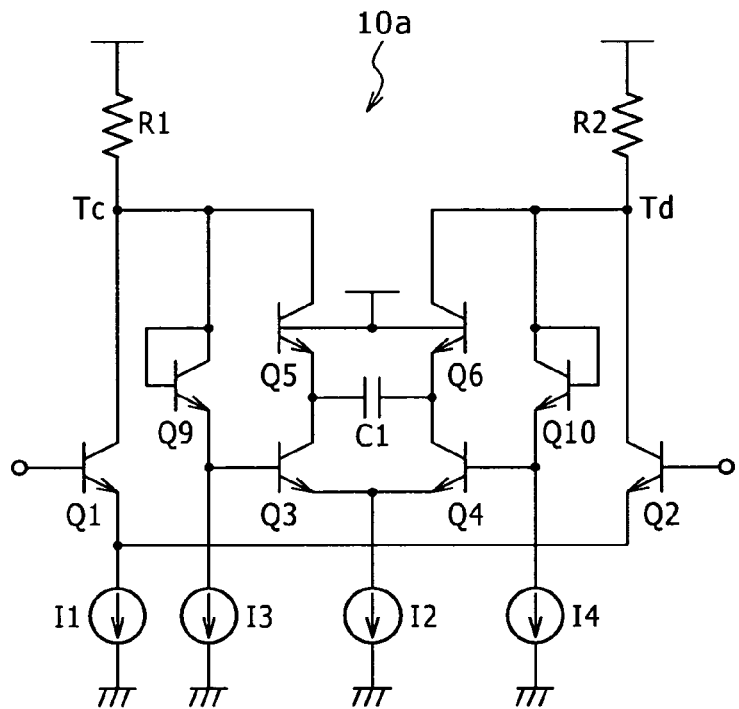
FIGS. 7 and 8 are circuit diagrams showing different modifications to the wide-band amplifier shown in FIG. 1.

A configuration of a wide-band amplifier 10a in which the gyrator circuit of FIG. 6 is connected in a differential configuration to the differential amplifier 20 is shown in FIG. 7. Referring to FIG. 7, the wide-band amplifier 10a does not have a feedforward operation because the input and the output of the gyrator circuit are connected to the differential output terminals Tc and Td of the differential amplifier 20, but only exhibits improvement in frequency characteristic by a resonance characteristic between the active inductor and the parasitic capacitance. It is to be noted that also a wide-band amplifier formed by connecting the gyrator circuit of FIG. 5 in a differential configuration to the differential amplifier 20 similarly exhibits only improvement in frequency characteristic by a resonance characteristic of the active inductor and the parasitic capacitance.

It is to be noted that the wide-band amplifier 10 shown in FIG. 1 eliminates the necessity for an element for assuring an operation point of the gyrator circuit such as, the capacitor C2 shown in FIG. 5 or the transistor Q9 shown in FIG. 6. Therefore, the gyrator circuit 30 is low in the parasitic capacitance and superior in high frequency characteristic. As a result, in the wide-band amplifier 10, the active inductor can operate with a higher frequency and can increase the frequency bandwidth.

Figure 8:
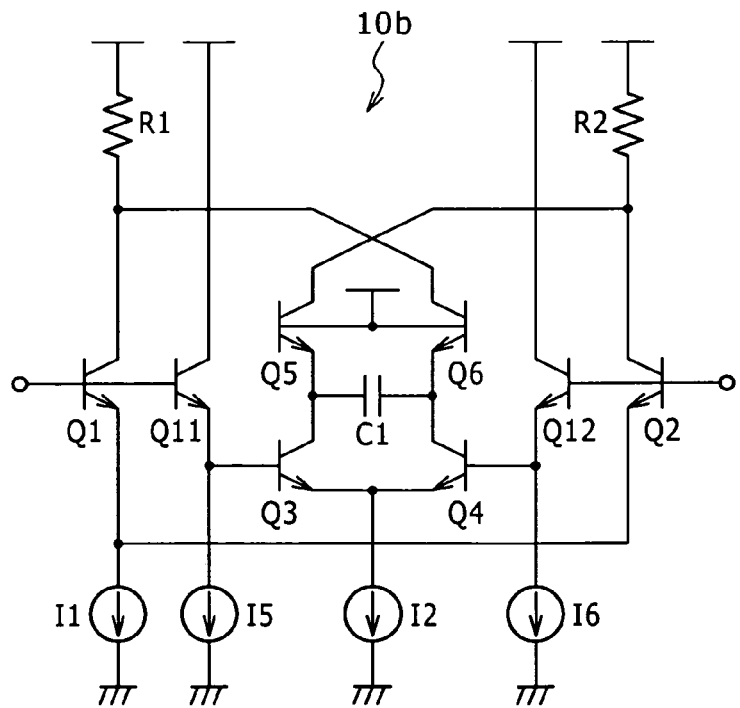

Or, the gyrator circuit 30 may be connected to the differential amplifier 20 through an emitter follower formed from a transistor Q11 and a current source I5 and another emitter follower formed from a transistor Q12 and a current source I6 as in the case of a wide-band amplifier 10b shown in. FIG. 8. By the configuration, the operations of the transistors Q3 and Q4 of the gyrator circuit 30 are provided with some margin, and the base potential of the transistors Q1, Q2, Q11 and Q12 can be set higher by an amount corresponding to the base-emitter voltage Vbe of the transistors Q11 and Q12.

4. Wireless Communication Apparatus

Now, a radio communication apparatus to which the wide-band amplifier 10, 10a and 10b described hereinabove are applied are described with reference to FIGS. 9 and 10. It is to be noted that the radio communication apparatus 50 according to the present embodiment is formed as a portable telephone set, and the wide-band amplifier 10 is applied as an example.

Figure 9:
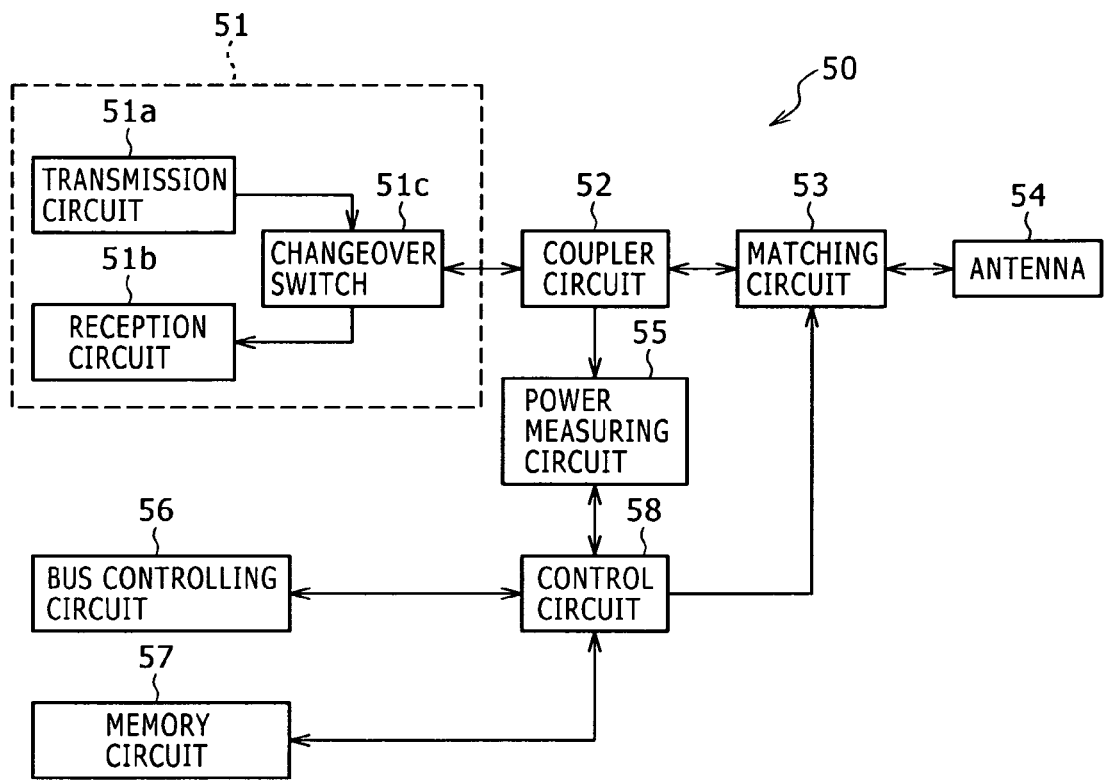
FIG. 9 is a block diagram showing a configuration of a radio communication apparatus to which the wide-band amplifier shown in FIG. 1 is applied.

Referring first to FIG. 9, the radio communication apparatus 50 includes a transmission/reception circuit 51, a coupler circuit 52, a matching circuit 53, an antenna 54, a power measuring circuit 55, a bus controlling circuit 56, a memory circuit 57, a control circuit 58 and so forth.

The transmission/reception circuit 51 includes a transmission circuit 51a, a reception circuit 51b and a changeover switch 51c. The transmission circuit 51a outputs a transmission signal for carrying out communication with another radio communication apparatus. The transmission circuit 51a is used also in order to signal a transmission signal for carrying out antenna tuning. The reception circuit 51b receives a reception signal outputted from the antenna 54 as an input thereto when communication is to be carried out with another radio communication apparatus and is used after antenna tuning comes to an end. It is to be noted that the reception signal is produced by conversion of a radio signal transmitted from a radio communication apparatus by means of the antenna 54. The changeover switch 51c separates a transmission signal and a reception signal and is configured using, for example, a switch circuit.

The coupler circuit 52 detects a traveling wave and a reflected wave of a transmission signal outputted from the transmission circuit 51a.

The matching circuit 53 is an impedance matching circuit having a variable impedance, and the impedance of the matching circuit 53 can be adjusted by varying an internal constant such as, a value of a capacitor for adjustment under the control of the control circuit 58.

The power measuring circuit 55 is configured using the wide-band amplifier 10 described hereinabove and measures the power of a traveling wave and a reflected wave detected by the coupler circuit 52.

The bus controlling circuit 56 controls the control circuit 58 by means of a microcomputer or the like not shown. The memory circuit 57 stores data for controlling the control circuit 58 and so forth.

The control circuit 58 controls the impedance of the matching circuit 53 based on a result of measurement of the power measuring circuit 55 so that transmission power can be delivered efficiently to the antenna 54.

In the radio communication apparatus 50 configured in such a manner as described above, when the transmission/reception frequency changes by a great amount, it is possible to prevent or suppress the impedance matching between the antenna 54 and the transmission/reception circuit 51 from being displaced. In particular, the radio communication apparatus 50 operates in the following manner.

First, the radio communication apparatus 50 measures an impedance matching state. At this time, the transmission circuit 51a outputs a test signal as a transmission signal so that the text signal is inputted to the antenna 54 through the coupler circuit 52. Part of the outputted test signal is reflected by the antenna 54 in response to a displacement amount in impedance and is inputted as a reflected wave to the coupler circuit 52.

The coupler circuit 52 separates and detects signals V1 and V2 which increase in proportion to the traveling wave and the reflected wave of the test signal as the transmission signal and outputs the detected signals V1 and V2 to the power measuring circuit 55. The power measuring circuit 55 detects the magnitude of the signals V1 and V2 and notifies the control circuit 58 of the detected magnitudes. The control circuit 58 compares the magnitudes of the signals V1 and V2 with each other to decide a reflection coefficient r which indicates the matching state between the transmission/reception circuit 51 and the antenna 54. It is to be noted that the relationship between the signals V1 and V2 and the reflection coefficient r can be represented by the following expression (2):

$$r = V2/V1 \qquad (2)$$

The control circuit 58 controls the matching circuit 53 in response to the decided reflection coefficient r. For example, the control circuit 58 changes the value of the adjustment capacitor of the matching circuit 53 by changing over a switch or the like to adjust the impedance of the matching circuit 53. Consequently, the transmission signal can be sent efficiently into the antenna 54.

Figure 10:
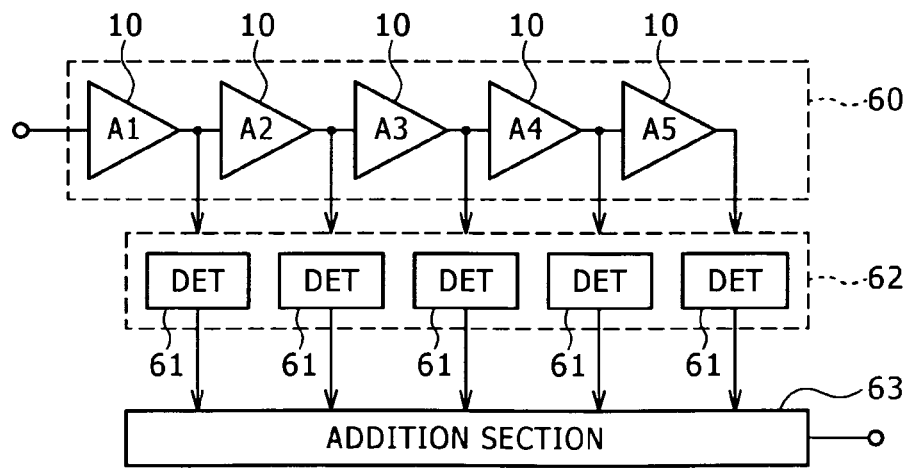
FIG. 10 is a block diagram showing a configuration of a power measuring circuit of the radio communication apparatus shown in FIG. 9.

A configuration of the power measuring circuit 55 is shown in FIG. 10. Referring to FIG. 10, the power measuring circuit 55 in the present embodiment includes a limiter amplifier circuit 60 formed by connecting a plurality of wide-band amplifiers 10 in cascade connection and a detection section group 62 having a plurality of detection sections 61 for detecting an output of the wide-band amplifiers 10, and an addition section 63 for adding outputs of the detection sections 61 and outputting a result of the addition.

In the power measuring circuit 55 shown in FIG. 10, outputs of the wide-band amplifiers 10 connected in cascade connection are individually detected and added so that they operate as a logarithmic converter. When a voltage Vi (Vrms) is inputted to the power measuring circuit 55, a voltage Vo (V) outputted from the addition section 63 can be represented in such a manner as given by the following expression (3):

$$Vo=0.8\times\log(Vi/0.224)+2 \qquad (3)$$

Accordingly, for example, when Vi=0.224 (Vrms), the DC output is Vo=2 (V). Meanwhile, when Vi=2.24 (mVrms), the DC output is Vo=0.4 (V).

The radio communication apparatus 50 in the form of a portable telephone set requires a wide frequency band, for example, from 100 MHz to 2.5 GHz in order to be ready for multiple frequency bands. Since the power measuring circuit 55 is configured by cascade connection of amplifiers, even a little drop of the high frequency gain per one stage of an amplifier is multiplied by the number of states into a great drop of the gain, resulting in difficulty in assurance of the frequency bands.

In a amplifier hitherto known, this drop of the high frequency gain is caused by limitation to the output signal band by a low-pass filter characteristic which depends upon the output impedance of a differential amplifier and parasitic capacitance appearing between differential output terminals. However, in the radio communication apparatus 50 according to the present embodiment, since the wide-band amplifier 10 described hereinabove for each of the amplifiers connected in cascade connection, it is possible to suppress drop of the high frequency gain and expand the frequency band width. For example, with the radio communication apparatus 50, it is possible to assure a wide band from 100 MHz to 2.5 GHz as seen from FIG. 3.

In this manner, by using the wide-band amplifier 10, a frequency characteristic of the power measuring circuit 55 can be improved, and also at a high frequency, a dynamic range for power measurement can be assured. Therefore, also at a high frequency, impedance matching can be carried out with a high degree of accuracy.

The present application contains subject matter related to that disclosed in Japanese Priority Patent Application JP 2010-120552 filed in the Japan Patent Office on May 26, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A gyrator circuit, comprising:
a first transconductance amplifier formed from a pair of transistors whose bases or gates serve as differential input terminals of said first transconductance amplifiers and whose collectors or drains serve as differential output terminals of said first transconductance amplifier;
a capacitor connected between the differential output terminals of said first transconductance amplifier; and
a second transconductance amplifier formed from a pair of transistors whose emitters or sources serve as differential input terminals of said second transconductance amplifiers and whose collectors or drains serve as differential output terminals of said second transconductance amplifier; wherein
the differential input terminals of said first transconductance amplifier and the differential output terminals of said second transconductance amplifier being separated from each other.
2. A wide-band amplifier, comprising:
the gyrator circuit according to claim 1; and
a differential amplifier; wherein
differential input terminals of said differential amplifier are connected to the differential input terminals of said first transconductance amplifier of said gyrator circuit, and
differential output terminals of said differential amplifier are connected to the differential output terminals of said second transconductance amplifier.
3. The wide-band amplifier according to claim 2, wherein the input terminals of said differential amplifier are connected to the differential input terminals of said first transconductance amplifier each through an emitter follower circuit.
4. A radio communication apparatus, comprising:
an antenna;
a transmission circuit for outputting a transmission signal to said antenna so that a radio signal is outputted from said antenna;
an impedance matching circuit connected between said antenna and said transmission circuit;
a detection circuit for detecting a traveling wave and a reflected wave of the transmission signal;
a power measuring circuit for measuring power of the traveling wave and power of the reflected wave; and
a control circuit for controlling said impedance matching circuit based on a result of the measurement by said power measuring circuit; wherein
said power measuring circuit includes a limiter amplifier section formed by cascade connection of a plurality of the wide-band amplifiers according to claim 2, a plurality of detection sections for individually detecting outputs of the wide-band amplifier, and an addition section for adding outputs of said detection sections.

* * * * *